United States Patent [19]
McLean, II et al.

[11] Patent Number: 5,747,120
[45] Date of Patent: May 5, 1998

[54] LASER ABLATED HARD COATING FOR MICROTOOLS

[75] Inventors: William McLean, II, Oakland; Mehdi Balooch; Wigbert J. Siekhaus, both of Berkeley, all of Calif.

[73] Assignee: Regents Of The University Of California, Oakland, Calif.

[21] Appl. No.: 799,085

[22] Filed: Feb. 11, 1997

Related U.S. Application Data

[63] Continuation of Ser. No. 624,231, Mar. 29, 1996, abandoned.

[51] Int. Cl.[6] .................................................. B05D 3/06
[52] U.S. Cl. .......................... 427/596; 427/249; 427/122; 427/309
[58] Field of Search .......................... 427/596, 249, 427/122, 309; 423/446; 428/408; 430/324; 51/307

[56] References Cited

U.S. PATENT DOCUMENTS

| | | | |
|---|---|---|---|
| 4,987,007 | 1/1991 | Wagal et al. | 427/596 |
| 5,098,737 | 3/1992 | Collins et al. | 427/53.1 |
| 5,366,556 | 11/1994 | Price et al. | 118/722 |
| 5,393,647 | 2/1995 | Neukermans et al. | 430/320 |
| 5,490,912 | 2/1996 | Warner et al. | 204/298.02 |

FOREIGN PATENT DOCUMENTS 04-99278  5/1992  Japan.

OTHER PUBLICATIONS

Voevodin et al., "Preparation of Amorphous Diamond-like Carbon by Pulsed Laser Deposition: a Critical Review", Surface and Coating Technology (1996) pp. 1–15.

Collins et al, Appl. Phys. Lett. 54(3) Jan. 1989, pp. 216–218.

*Primary Examiner*—Roy V. King
*Attorney, Agent, or Firm*—L. E. Carnahan; Henry P. Sartorio

[57] ABSTRACT

Wear-resistant coatings composed of laser ablated hard carbon films, are deposited by pulsed laser ablation using visible light, on instruments such as microscope tips and micro-surgical tools. Hard carbon, known as diamond-like carbon (DLC), films produced by pulsed laser ablation using visible light enhances the abrasion resistance, wear characteristics, and lifetimes of small tools or instruments, such as small, sharp silicon tips used in atomic probe microscopy without significantly affecting the sharpness or size of these devices. For example, a 10–20 nm layer of diamond-like carbon on a standard silicon atomic force microscope (AFM) tip, enables the useful operating life of the tip to be increased by at least twofold. Moreover, the low inherent friction coefficient of the DLC coating leads to higher resolution for AFM tips operating in the contact mode.

16 Claims, 4 Drawing Sheets

LASER ABLATED HARD COATING FOR MICROTOOLS

This is a Continuation of application Ser. No. 08/624,231 filed Mar. 29,1996, now abandoned.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to hardening of tools, particularly to hardening of small instruments, such as scanning probe microscope tips, and silicon based microsurgical instruments, and more particularly to the formation of laser ablated hard carbon films for wear-resistant coatings on small instruments such as microscope tips.

Many thousands of Si and $Si_3N_4$ tips are consumed annually in atomic force microscopes (AFMs) and tips used in scanning tunneling microscopy (STM). Also, microsurgical instruments made from silicon have a short lifetime and are thus expensive.

Diamond-like carbon (DLC) coatings have been previously produced by laser ablation, as exemplified by U.S. Pat. No. 4,987,007 issued Jan. 22, 1991 to S. S. Wagal et al.; and U.S. Pat. No. 5,098,737 issued Mar. 24, 1992 to C. B. Collins et al. Also, hard carbon or diamond-like carbon coatings have been recently produced by laser ablation using copper vapor lasers, for example; and such coatings have been shown to be relatively smooth (1–5 nm RMS roughness), are extremely hard (typically 60 GPa), and possess low friction coefficients. Such laser ablated hard carbon films are produced, for example, by the apparatus and method described and claimed in U.S. Pat. No. 5,490,912, issued Feb. 13, 1996, entitled Apparatus For Laser Assisted Thin Film Deposition", and U.S. application Ser. No. 08/527,993 filed Sep. 14, 1995, entitled Method For Laser Assisted Thin Film Deposition, which is a continuation of application Ser. No. 08/251,130, filed May 31, 1994, now abandoned, each being assigned to the same assignee as the instant application. The above-referenced patent and copending applications involve an apparatus and method for producing a thin layer or film of material on a surface or substrate by laser ablation that uses visible light and a laser output beam at a high repetition rate (500–10,000 Hz), as well as enabling the laser source or sources to be positioned at remote locations from the deposition chamber and employ fiber optics to direct laser light to one or more locations in the deposition chamber from one or more sources. The output beam from the one or more sources is pulsed at a low pulse energy of about 2–10 millijoules/pulse, and with a short pulse length, such as 20–50 nanoseconds, with laser irradiance on the target of less than about $10^{10}$ W/cm$^2$.

The useful lifetime of small instruments and tools, such as tips for an AFM or STM, is dependent on surface conditions such as the hardness and smoothness of the samples being examined by a tip. In many cases these tips have a useful life of less than an hour. Also, the initial sharpness of the tips is one criterion that determines their value, but an equally important criterion is the sharpness maintained during operation.

The cost of a silicon (Si) disk containing 388 Si tips having an initial tip radius of curvature between 5 to 10 nm is several thousand dollars. The cost of a disk containing 500 $Si_3N_4$ tips having an initial radius of curvature between 20 to 50 nm is about $1,500. Solid diamond tips are sold at a cost of between $450 and $1,000 per tip. The commercial Si tips lose their initial sharpness quickly during use and become dull (i.e., have a radius of curvature much larger than the initial radius of curvature). Thus, the cost of new tips and the down-time needed to periodically change tips is a major operational cost factor.

There is a need in the art of AFMs and STMs for tips which have an increased lifetime, thereby reducing the operation costs. The present invention fills that need by adding a low friction, hard carbon coating to the tip, which increases the lifetime by at least twofold. By maintaining the tip radius of curvature the utility of the AFM or STM measurement techniques is enhanced. This is accomplished by depositing a thin 10–20 nm layer or coating of diamond-like carbon over a standard Si AFM tip, for example, by laser ablation in the visible light spectrum, rather than ultraviolet or infrared customarily used for pulsed laser deposition. Also, where tips are being initially fabricated, deposition of the hard carbon thereon does not significantly increase the radius of curvature compared to the radius of curvature of an oxidizing silicon tip. Further, the oxide coating on a previously made tip can be removed and the hard carbon coating applied prior to further oxidation without increase in the radius of curvature above that of the oxidized tip. The invention is not limited to microscope tips but can be applied, for example, to micro-surgical instruments fashioned in materials such as silicon by standard etching and fabrication techniques, or other small tools or instruments fabricated from silicon or other materials or metals on which a thin film of hard carbon can be deposited. This includes: (a) low friction coatings for magnetic read/write devices and/or media, (b) coated Si tips for use as nano-indentors, and (c) as an inert coating on Kelvin probes.

SUMMARY OF THE INVENTION

It is an object of the invention to extend the useful lifetime of small tool, instruments, etc.

A further object of the invention is to provide a wear-resistant coating for instruments made of silicon, for example, without significant increase in the dimensions thereof.

Another object of the invention is to provide visible light laser ablated hard carbon films for wear surfaces.

Another object of the invention is to provide improved tips for atomic force microscopes (AFM) and tips for scanning tunneling microscopy (STM) by using laser ablation in the visible spectrum of a thin coating (10–20 nm) of diamond-like carbon thereon.

Another object of the invention is to provide sharp instruments which are subject to oxidization with a hard carbon coating for preventing chemical reactions, such as oxidization, while increasing the useful lifetime of the instrument.

Another object of the invention is to coat silicon containing AFM tips with a hard carbon using laser ablation in the visible spectrum without significant increase of the radius of curvature of the tip.

Other objects and advantages of the invention will become apparent from the following description and accompanying drawings. Basically the invention involves laser ablation of hard carbon films as wear-resistant coatings on instruments, such as the tips of an atomic force microscope (AFM), the laser ablation being in the visible spectrum. For example, a thin (10–20 nm) film of diamond-like carbon over a standard silicon AFM tip increase the operating life of the tip at least twofold. By enhancing the lifetimes of such tips by 0.1 or less, for example, value is added. Moreover, the low inherent friction coefficient of the hard carbon coating leads to higher resolution for AFM tips operating in the contact mode. Similar materials and construction techniques are applicable for nanoscale surgical instruments, and because the hard carbon films are chemically resistant and biocompatible (in addition to being hard, smooth, and slippery), they are a good candidate coating for this application as well. By depositing the hard carbon on the instrument at the time of its initial fabrication oxidization of the instrument is prevented, or by removal of the oxidization and coating with the hard carbon, the size of the instrument over that with the oxidization thereon is approximately the same. Thus, for AFM tips composed of silicon, for example, the radius of curvature for the hard carbon coated silicon tip would be about the same as that of an oxidized uncoated silicon chip. Since the hard carbon coatings produced by laser ablation are known to be electrically conductive, tips used in scanning tunneling microscopy (STM) can be fabricated using the present invention. STM tips of many different types of materials (metal, insulators, semiconductors) may be coated to yield tips with a desirable low work function of hard carbon (diamond-like carbon) and its known hardness. Because of the diamond-like carbon (DLC) hardness, coated STM and AFM tips may be used for imaging as well as for indentation (such as is done for nanolithography and nano-indentations to define material on the submicron scale).

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The present invention involves the deposition of a thin layer of hard carbon (i.e. carbon with a high percentage of tetrahedrally bonded carbon, such as $sp^3$ hybridized and carbonaceous on a material by laser ablation which utilizes visible light and a laser output beam at a high repetition rate (500–10,000 Hz). The hard carbon (diamond-like carbon) is laser ablated as a wear-resistant coat onto tips of an atomic force microscope (AFM). The diamond-like carbon (DLC) coating or film in a thickness of 10–20 nm increases the operational or useful lifetime of an AFM tip twofold or greater. In addition, the DLC coating maintains the sharpness of the AFM tip, hence the utility of the measurement technique is enhanced because the initial sharpness of the tip is maintained by the wear coating and does not become dull (i.e., has a radius of curvature similar to that of the initial tip. Also, the low inherent friction coefficient of the DLC coating leads to higher resolution for AFM tips operating in the contact mode.

The DLC wear-resistant coating procedure may be applied to tips used in scanning tunneling microscopy (STM) as well as tips for AFM since DLC coatings produced by laser ablation are known to be electrically conductive. STM tips of many different types of materials (metals, insulators, semiconductors) may be coated to yield tips with the desirable low work function of DLC and its known hardness. Because of DLC's hardness, coated STM and AFM tips may be used for imaging as well as for indentation (such as done for nanolithography and nanoindentations to define material properties on the submicron scale.

By incorporation of the hard carbon laser ablation technique into the fabrication process for producing silicon AFM tips, for example, the wear-resistant coating can be applied prior to an oxidation of the silicon tip, such that the radius of curvature of the hard carbon coated chip is substantially the same as the radius of curvature of an oxidized silicon tip. In other words, the thickness of the hard carbon coating and that of the oxide layer on the silicon tip is essentially the same. In addition, the oxide layer of a previously fabricated silicon tip can be removed by etching, etc., and the silicon tip ablation coated with hard carbon, whereby the radius of curvature of the oxidized tip and the cleaned, hard carbon coated chip are substantially the same.

Another application of laser ablated hard carbon is in forming hard, corrosion resistant coatings on micro-surgical instruments or tools formed from silicon by standard silicon etching and fabrication techniques. Thus, due to the decreased corrosion of such instruments and tools normally caused by body fluids, a significant increase in the life cycles of the instruments or tools are obtained.

Figure 1:
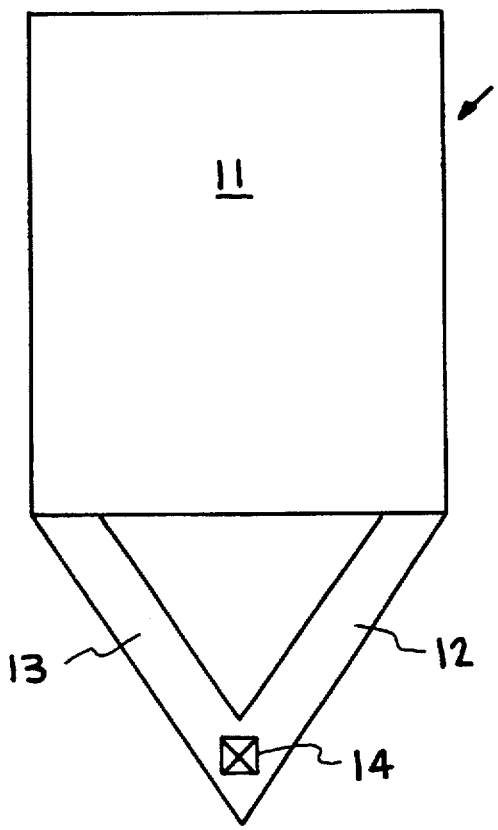
FIG. 1 is a plan view of an embodiment of an $Si_3N_4$ tip laser ablated with hard carbon in accordance with the present invention.
Figure 2:
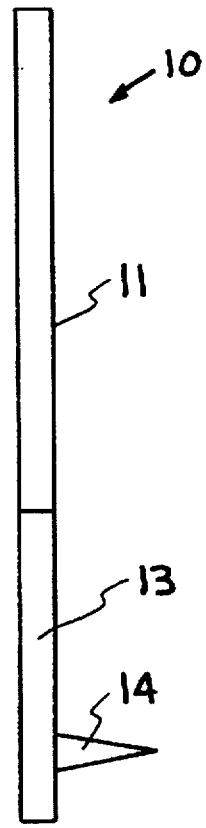
FIG. 2 is a side view of the embodiment of FIG. 1.
Figure 3:
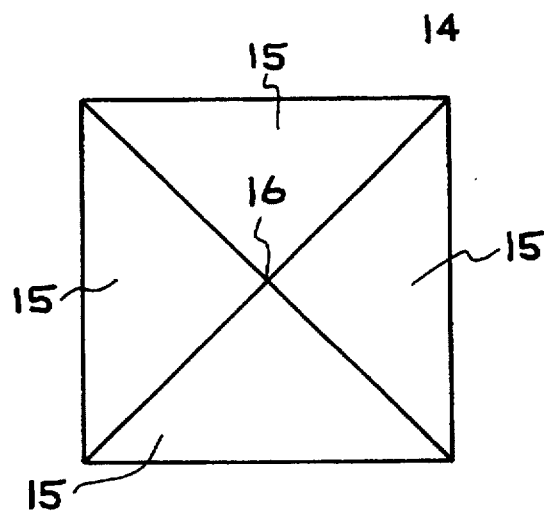
FIG. 3 is an enlarged view of the tip of the FIGS. 1-2 embodiment.
Figure 4:
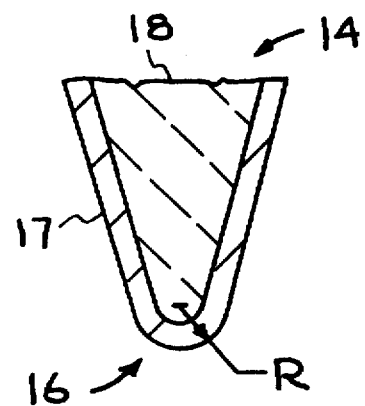
FIG. 4 is a greatly enlarged view of the end section of the hard carbon coated tip of FIG. 3.

Referring now to the drawings, FIGS. 1–4 illustrate an $Si_3N_4$ AFM tip holder assembly generally indicated at 10 and composed of a body section 11 and a pair of arms 12 and 13 forming a V-shaped support on which a tip 14 is mounted, as seen in FIGS. 1 and 2. The tip 14 in this embodiment, as shown enlarged in FIG. 3, is formed by four (4) tapered sides 15 which join at a point 16. FIG. 4 is an enlarged view of point 16 of FIG. 3 showing a DLC coat 17 on an $Si_3N_4$ tip end 18 which has a radius of curvature indicated at R, which for example is equal to 20–50 nm. The DLC coat 17 may, for example, have a thickness of 10–20 nm.

Figure 5:
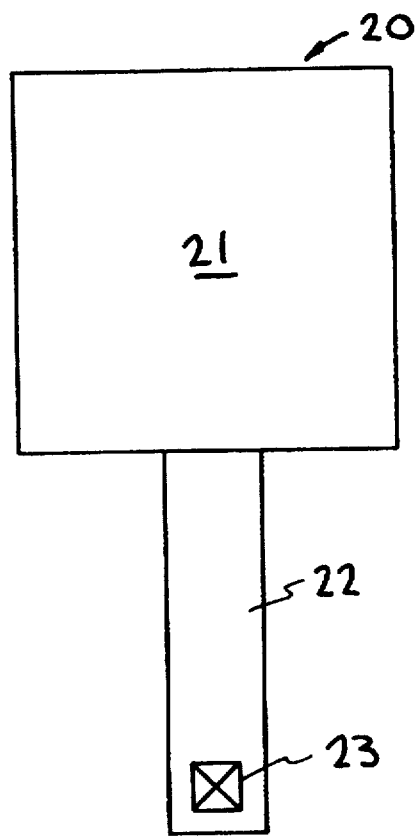
FIG. 5 is a plan view of an embodiment of a silicon (Si) tip which is laser ablated with hard carbon in accordance with the invention.
Figure 6:
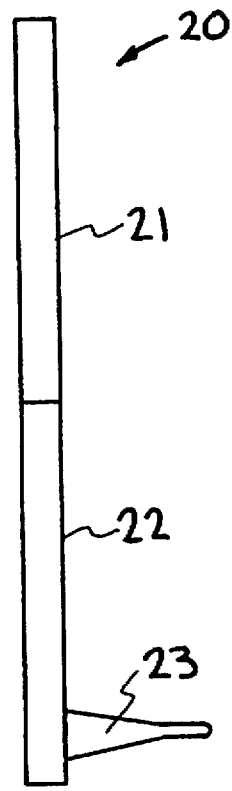
FIG. 6 is a side view of the FIG. 5 embodiment.
Figure 7:
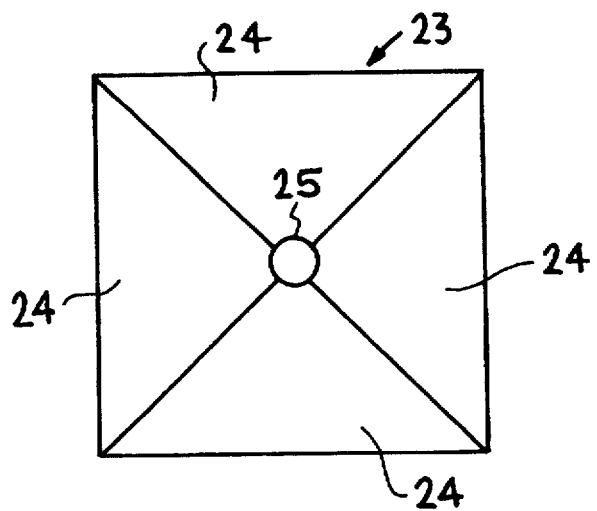
FIG. 7 is an enlarged view of the tip of the embodiment of FIGS. 5-6.
Figure 8:
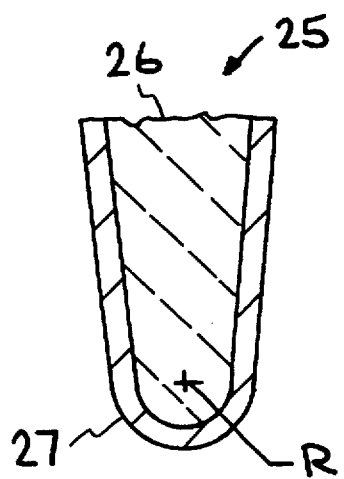
FIG. 8 is a greatly enlarged view of the end section of the tip of FIG. 7.

FIGS. 5–8 illustrate a silicon (Si) tip holder assembly generally indicated at 20 and composed of a body section 21, and a support arm 22 on which a tip 23 is mounted, as shown in FIGS. 5 and 6. The tip 23, as shown enlarged in FIG. 7, includes four (4) tapered sides 24 which join to form a tapered end 25. As shown enlarged in FIG. 8, an outer end 26 of tapered end 25, having a radius of curvature indicated at R, is coated with DLC as indicated at 27, which may for example have a thickness of 10–20 nm. In this embodiment R=5–10 nm.

Figure 12:
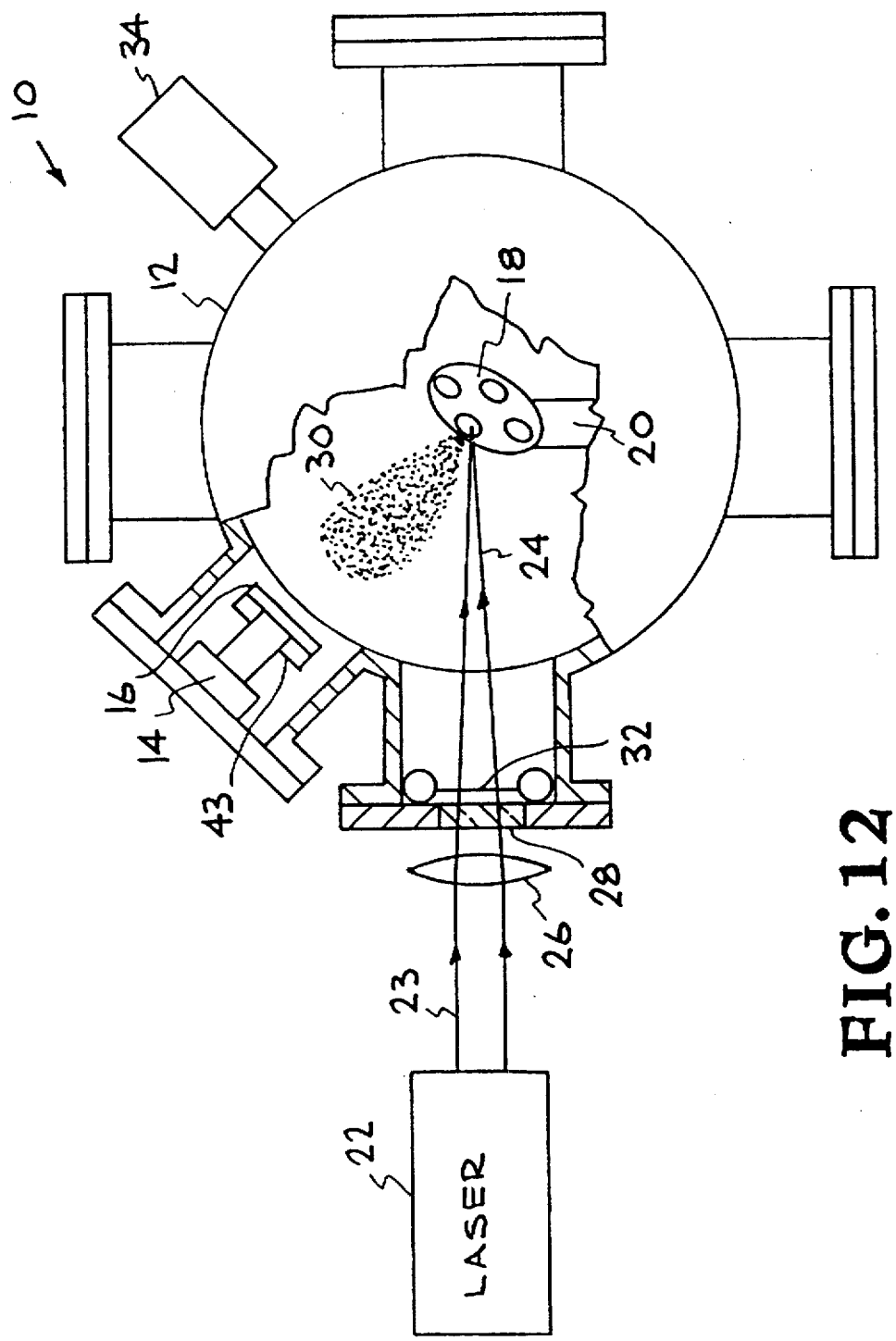
FIG. 12 is a partial cross-sectional and partial cut-away view of an apparatus for laser ablation of material with hard carbon (diamond-like carbon).

The tips 14 (FIGS. 1-4) and 23 (FIGS. 5-8) are created, for example, by microfabrication techniques on a six (6) inch wafer (388-500 tips/wafer). To accomplish the DLC coating of the tips, the wafer is mounted in a laser ablation facility, such as illustrated in FIG. 12, described hereinafter, with the wafer oriented such that the ablated material strikes the tips. The wafer is rotated during deposition such that all sides of the tips are coated uniformly.

Figure 10:
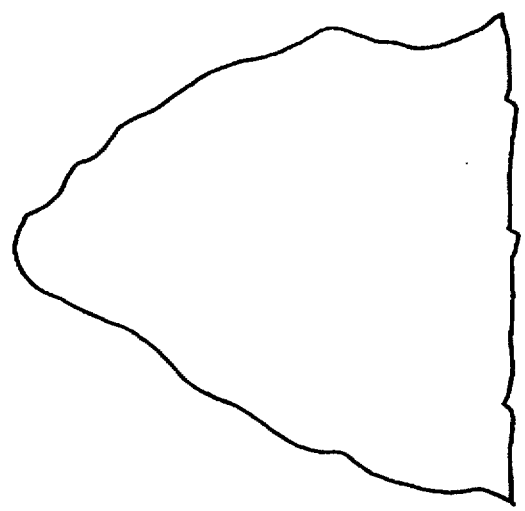
FIG. 10 is an SEM image of the uncoated silicon tip of FIG. 9 after scanning a specimen for a time period.
Figure 9:
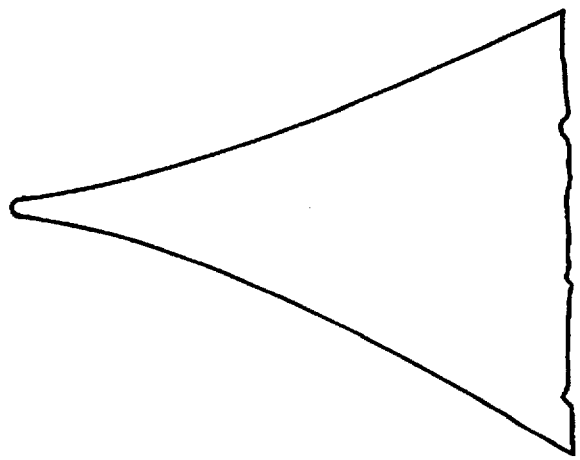
FIG. 9 is an SEM image of a silicon tip without hard carbon and the wear-resistant coating.

A silicon (Si) tip coated in this manner was mounted in the tip-holder of an AFM, brought in contact with a rough SiC surface with a force estimated to be ~1 μN. The tip was then scanned across the surface in a pattern covering 40 μm$^2$ with a scanning speed of ~80 μm/s for approximately 2.5 hours, thus covering approximately 36 cm. An uncoated Si tip was subjected to the same procedure. FIG. 9 is a SEM image of the uncoated Si tip. FIG. 10 is a SEM image of the uncoated tip of FIG. 9 after scanning a SiC specimen for 2.5 hours. Note the loss of sharpness and build-up of debris.

Figure 11:
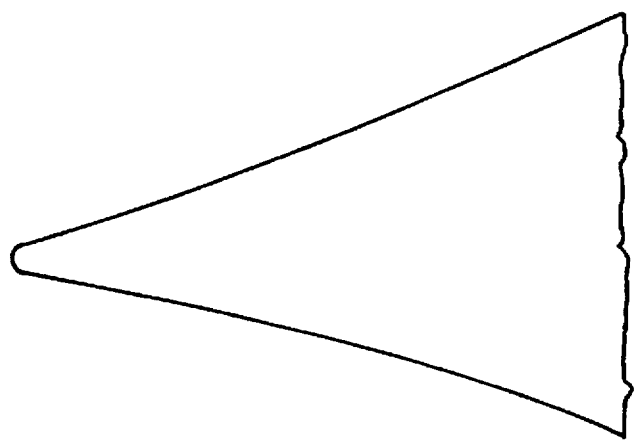
FIG. 11 is an SEM image of a silicon tip with a 200 Angstrom overlayer of diamond-like carbon after scanning a similar specimen for a similar time period as the uncoated tip of FIG. 9.

FIG. 11 is a SEM image of the Si tip with a 200 Angstrom overlayer of DLC after scanning a SiC specimen under identical conditions to the tip in FIG. 10. Note that the DLC coated tip has retained its sharpness. The uncoated Si tip (FIG. 9) loses its sharpness during operation and degrades such that the practical operational radius of curvature of the end of the tip is much larger than the original radius of curvature. The DLC coated tip (FIG. 11) starts with a radius of curvature slightly larger than the uncoated tip of FIG. 9 because of the addition of the 10-20 nm coating to the tip, but has the advantage that it maintains this radius of curvature, where R=R$_{Si}$+DLC, and has a smaller practical operational radius of curvature during its lifetime.

The thickness of the DLC coating necessary to achieve the desired robustness may be much less than the 10-20 nm thickness used in experimental coating, and the thickness of the coating may be reduced to as low as 1 nm, but such has not yet been experimentally verified. It should also be noted that the DLC coating will be applied during the production cycle of the 6 inch wafers, and preferably before the surface of the silicon tip is oxidized, thus reducing the outer radius of curvature of the coating. If necessary, an oxide coating produced on the silicon tips during the production process can be removed by known techniques such as heating and UHV conditions. Applying the DLC coating to a Si surface (rather than an oxidized surface) lead to improved adherence of the DLC coating. Moreover, applying the DLC coating after removing the oxide layer from the surface of the silicon tip will lead to a finished DLC coated product with a radius of curvature close to the radius of curvature of the oxidized silicon tip.

FIG. 12 illustrates an apparatus, such as described and claimed in the above-referenced copending applications for producing laser ablated hard carbon (diamond-like carbon) on a substrate or silicon wafer, such as described above in the production of the tips of the FIGS. 1-4 and 5-8 embodiments. The laser ablation system generally indicated at 10 includes a chamber 12, which may or may not be maintained at vacuum conditions depending on the desired product thin film chemistry, a substrate 14 supporting a substrate 16 to be coated with the thin film, a rotating target 18, a target support 20, a laser source 22, a fiber optic delivery system 23, an output beam of visible light 24, a focus lens assembly 26, and a laser input window 28.

A variety of substrate 16 materials can be used, depending on the application. Examples of suitable materials include but are not limited to refractory metals, metal oxide carbides, nitrides and borides, including SiO$_2$, Si, Si with Cr overlay, tool steel, WC and ZnS. For the production of the tips described above, the substrates or wafers would be Si or Si$_3$N$_4$.

Laser source 22 produces visible output beam 24. Suitable lasers include copper vapor and a frequency doubled Nd:YAG laser such as Model No. 803, available from Laserscope, San Jose, Calif. Other pulsed laser sources producing visible light at high repetition rates are suitable. Laser source 22 provides pulsed output 24 at a high repetition rate, and can be run in a Q-switched mode. High repetition rate is deemed to be greater than about 500 Hz, and preferably greater than about 1000 Hz up to about 10 kHz. Output beam 24 is pulsed at a low pulse energy, such as in the range of about 2 to 100 millijoules per pulse. Additionally, output beam 24 has a short pulse length of about 20 to 50 nanoseconds.

Output beam 24 passes through a focusing lens 26 and is directed through input window 28. It is incident upon moving target 18 at a non-perpendicular angle, striking target 18 from above at an oblique angle. An ablation plume 30, generally normal to target 18, is a plasma of ions and energetic neutral atoms that coats substrate 16 as a thin film of material. Output beam 24 can be dithered in order to strike numerous sites on target 18. Additionally, output beam 24 can be defocused as it strikes target 18. The irradiance of output beam 24 on target 18 is less than about $10^{10}$ W/cm$^2$, and it is directed at target 18 with not more than about 10 to 20 laser pulses on the same spot.

Target support 20 can be biased to create an accelerating grid to add energy to the ions in plume 30. This reduces stress in substrate 16 and thicker thin films are possible. The creation of the accelerating grid helps substrate 16 adhere to certain materials. The bias can be pulsed so that the timing of the arrival of ions to substrate 16 can be controlled. Additionally, pulsing the bias permits selectivity of the portion of the plume to be accelerated. Ions can be driven in, the bias can be switched from negative to positive, and then electrons can be pulled in to neutralize the surface charge of the thin film on substrate 16.

The majority of the visible wavelength output beam 24 is not absorbed by plume 30. Within 3 or 4 nanoseconds after output beam 24 strikes target 18, the temperature of the spot where the beam strikes is raised and becomes either a liquid or sublimes. Each pulse of light removes only a fraction of a micron of target material 18. By limiting the number of light pulse exposures on any one target location, the generation of large pieces of ejected target material are minimized and the thin film that is created has a substantially uniform surface structure. Small fractions of a micron of target 18 are removed in order to achieve this uniform surface.

Target holder 20 is rotated and also moved in a direction along its longitudinal axis in order to remove only small fractions of target 18 material at any one time. Another embodiment of target holder 20 is described further herein.

Deposition rates of thin film on substrate 16 are much greater than in prior pulsed laser deposition methods. Depositions volumes on the order of 1000 μm-cm$^2$/hr are obtained. In many applications the deposition rate is greater than about 5000 μm-cm$^2$/hr.

In order to reduce the need for frequent replacement of input window 28, a window protection system 32 is used. Because visible light is used, window protection system 32 can be a roll of transparent material, such as Mylar, that covers substantially the entire window 28 so that material ejected during the pulsed laser ablation process is not deposited on window 32. The roll of Mylar is periodically advanced so that output beam 24 can be directed into chamber 12 without interference. The roll of Mylar can be positioned within chamber 12 in order to maintain the desired vacuum conditions. A commercially available 2.5 µm thick Mylar film can be continuously advanced past the vacuum side of window 3. It can be refreshed periodically, for example every $5 \times 10^4$ laser pulses, and does not lead to loss of laser power. A reel-to-reel device for moving fresh film in front on window 32 is suitable and spreads the mylar uniformly to ensure a relatively uniform optical path length through it.

Chamber 12 can be operated at high vacuum, less than about $1 \times 10^{-6}$ torr, or with a desired atmosphere such as oxygen or nitrogen, depending on the particular thin film. A vacuum source 34, such as a turbomolecular pump, is used to evacuate chamber 12 as needed.

When graphite is the selected target material to produce a diamond-like carbon (DLC) thin film, a hydrogen atom beam, not shown, scavenges graphite from the DLC film. This can be enhanced with modifying the surface temperature of the thin film by use of a substrate heater assembly 43 to heat or cool substrate support 14 in a controlled manner. The reactive gas beam is directed at substrate 16. By pulsing the reactive gas beam between laser pulses, the average vacuum in chamber 12 can be maintained at levels sufficient to assure material transport from the target 18 to substrate 16 with or without inducing particle collisions within plume 30. By directing the reactive gas beam to substrate 16, local pressures at the surface of substrate 16 are created but these do not affect the general pressure throughout chamber 12. Essentially, the majority of the collisions from the reactive gas beam are directed between the thin film on substrate 16 and the reactive gas, such as hydrogen.

In the case of DLC formation, the pulses of the reactive gas beam are out of phase with laser 22. However, there are certain applications where it is desirable for the reactive gas and laser pulses to be in phase.

During the initial experimental testing of the apparatus of FIG. 12, DLC coatings or thin films were produced, as set forth as follows:

A single copper vapor laser (CVL) oscillator and one (C-laser) amplifier of the LDF laser system operated for the Laser Materials Processing (LMP) facility at the Lawrence Livermore National Laboratory, Livermore, Calif., was used to produce DLC film with the following operating parameters:

| | |
|---|---|
| Wavelength: | 510 nm, 578 nm (2:1) |
| Beam Size: | 50 to 300 µm |
| Power Density: | $2 \times 10^{10}$ to $4 \times 10^8$ W/cm$^2$ |
| Pulse Width: | 50 ns (FWHM) |
| Target Speed: | 8 cm/s |
| Target - Substrate Distance: | 7.6 cm |
| DLC Deposition Rate: | $5.6 \times 10^{-2}$ Å/pulse at $4 \times 10^8$ W/cm$^2$ |
| | $1.0 \times 10^{-3}$ Å/pulse at $2 \times 10^{10}$ W/cm$^2$ |

The optical delivery system was comprised of a discrete optics delivery system to transmit the beam and a single 500 mm focusing lens located adjacent to the vacuum deposition tank. Relatively low irradiance, $5 \times 10^8$ W/cm$^2$, was used on the target. The beam was defocused on the target.

The output beam was introduced through a fused silica window. The graphite target rod was 1 inch in diameter and mechanically rotated at approximately 1 RPS and could be manually moved axially to expose fresh (unilluminated) surfaces. POCO graphite (AXM-5Q grade) that was subjected to high temperature (2000° C.) treatments of flowing $F_2$ or $Cl_2$ gas to remove trace metal impurities was used. This level of pretreatment may not be required. The laser was aligned to strike the rod off center so that the laser plume was at 45 or 60 degrees to the incident beam. The substrate to be coated was mounted within a sample port that was easily removed for deposition on multiple substrates. A turbomolecular pump was used to achieve a base pressure of $5 \times 10^{-8}$ torr. For each set of deposition runs the vacuum chamber was heated up and outgassed. Typical vacuum levels during deposition episodes were in the $10^{-6}$ torr range. Assist or buffer gases were not used. A variety of substrates were used, including, $SiO_2$, Si, Si with Cr overlay, tool steel, WC and ZnS.

Because of DLC deposition on the fused silica window, input windows were extended from the chamber to a 330 mm standoff to decrease the window coating rate and thus increase their useful lifetime.

Laser irradiance was varied between $3 \times 10^{10}$ W/cm$^2$ and $10^{10}$ W/cm$^2$. An electron energy loss spectrum for DLC material was produced, and it indicated a lack of π-bond spectra associated with graphitic or glassy carbon.

Silicon substrates were masked while both the target irradiance and number of laser pulses were controlled to quantify the volume of DLC grown. Spatial distribution and growth rate of the product film were determined by measuring film thickness as a function of position with a diamond stylus profilometer at the step-up provided by the masked area.

Atomic force microscopy (AFM) was used to measure surface roughness. A 400 nm thick DLC film was determined to have a surface roughness, as measured by the AFM, of 3.6 nm.

In addition to the use of DLC coatings or films on AFM tips, the DLC coating procedure may be applied to tips used in scanning tunneling microscopy (STM) since DLC coatings produced by laser ablation are known to be electrically conductive. STM tips of many different types of materials (metals, insulators, semiconductors) may be coated to yield tips with a desirable low work function of DLC and its known hardness. In addition to the application of DLC to AFM and STM tips, the coatings may be used in other applications for forming hard, corrosion resistant coatings on micro-surgical instruments fabricated from Si, for example, by standard Si etching and fabrication techniques. As pointed out above, it is preferable to apply the DLC coating to silicon surfaces prior to oxidation of the silicon.

While the instrument has been described using hard carbon coatings on silicon, other coating materials such as refractory metals, metal oxides, metal carbides, method borides and metal nitrides are also applicable.

It has thus been shown that the present invention provides for increasing the useful lifetime of small instruments or tools, such as AFM or STM tips. While increasing the lifetime of such tips, the hard carbon coating applied thereon does not adversely affect the function of the tips, nor significantly increase the radius of curvature thereof. In addition, where the hard carbon coating is laser ablated during the formation of silicon tips, for example, and applied prior to formation of oxidation of the silicon tips, or after removal of the oxide layer, the radius of curvature of the final coated product is about the same as for an oxidized silicon tip.

While particular embodiments, parameters, etc. have been set forth to exemplify and explain the principles of the invention, such are not intended to be limiting. Modifications and changes may become apparent to those skilled in the art, and it is intended that the invention should be limited only by the scope of the appended claims.

The Invention claimed is:

1. A method for improving the useful lifetime of instruments and tools, comprising:

depositing by laser ablation in a visible light spectrum with a repetition rate of 500–10,000 Hz and with a deposition rate of 1000–5000 μm-cm²/hr a film of diamond-like carbon to a thickness of not greater than about 20 nm on wear surfaces of said instruments and tools.

2. The method of claim 1, wherein depositing of the film is carried out using a laser pulse energy in the range of about 2 to 100 millijoules per pulse.

3. The method of claim 1, additionally including forming at least the wear surfaces from a material selected from the group consisting of $SiO_2$, Si, Si with Cr overlay, tool steel, WC and ZnS, and depositing the diamond-like carbon thereon prior to oxidation of the wear surfaces.

4. The method of claim 1, wherein said material is silicon.

5. The method of claim 1, additionally including removing any oxidation from the wear surfaces prior to depositing the diamond-like carbon thereon.

6. The method of claim 5, additionally including forming the wear surfaces from material selected from the group consisting of Si, $Si_3N_4$, $SiO_2$, refractory metals, metal borides, carbides, nitrides, and oxides.

7. The method of claim 1, additionally including depositing by laser ablation the diamond-like carbon using a pulse length of about 20 to 50 nanoseconds.

8. The method of claim 1, wherein depositing by laser ablation is carried out by directing a laser beam onto at least one movable target and wherein the irradiance of the laser beam on the target is less than about $10^{10}$ W/cm², and wherein the laser beam is directed at the target with not more than about 10–20 laser pulses on the same spot on the target.

9. The method of claim 8, additionally including providing means for moving the at least one target.

10. The method of claim 8, additionally including directing the laser beam onto the at least one target so as to produce an ion plume from the target at an angle to the laser beam.

11. A method for improving a tip for use in a device, including an atomic force microscope, comprising:

providing a tip from material selected from the group consisting of Si, $Si_3N_4$, $SiO_2$, refractory metals, and metal borides, carbides, nitrides, and oxides;

applying by laser ablation in a visible light spectrum with a repetition rate of 500–10,000 Hz and with a deposition rate of 1000–5000 μm-cm²/hr a film of diamond-like carbon having a thickness of 1–20 nm on at least the wear surfaces of the tip.

12. The method of claim 11, additionally including removing oxidation from at least the wear surfaces of the tip prior to applying the film of diamond-like carbon.

13. The method of claim 11, additionally including forming the film of diamond-like carbon using a laser pulse energy in the range of about 2–100 millijoules per pulse.

14. The method of claim 13, wherein forming the film of diamond-like carbon is carried out using a pulse length of about 20–50 nanoseconds.

15. The method of claim 11, additionally including forming the tip; and applying the film of diamond-like carbon prior to oxidization of at least the wear surfaces of the tip.

16. The method of claim 15, wherein forming of the tip is carried out so that at least the wear surfaces of the tip are composed of silicon.

* * * * *